United States Patent
Oishi et al.

(10) Patent No.: US 7,313,873 B2
(45) Date of Patent: Jan. 1, 2008

(54) SURFACE POSITION MEASURING METHOD, EXPOSURE APPARATUS, AND DEVICE MANUFACTURING METHOD

(75) Inventors: Satoru Oishi, Utsunomiya (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 27 days.

(21) Appl. No.: 11/489,896

(22) Filed: Jul. 20, 2006

(65) Prior Publication Data

US 2007/0017110 A1 Jan. 25, 2007

(30) Foreign Application Priority Data

Jul. 21, 2005 (JP) .............................. 2005/210775

(51) Int. Cl.
*G01B 11/00* (2006.01)
(52) U.S. Cl. .................. 33/645; 257/797; 438/401; 356/400
(58) Field of Classification Search .................. 33/645; 257/797; 438/401; 356/400
See application file for complete search history.

(56) References Cited

U.S. PATENT DOCUMENTS

| | | | |
|---|---|---|---|
| 5,448,332 A | 9/1995 | Sakakibara et al. | ........... 355/53 |
| 5,693,439 A | 12/1997 | Tanaka et al. | ................ 430/30 |
| 6,433,872 B1 | 8/2002 | Nishi et al. | .................. 356/400 |
| 6,608,681 B2 | 8/2003 | Tanaka et al. | .............. 356/400 |
| 6,936,385 B2 * | 8/2005 | Lof et al. | .................... 438/401 |
| 7,193,715 B2 * | 3/2007 | Smedt et al. | ............... 257/797 |
| 7,236,244 B1 * | 6/2007 | Yang et al. | .................. 356/400 |
| 2005/0130386 A1 * | 6/2005 | Watanabe et al. | ........... 438/401 |

FOREIGN PATENT DOCUMENTS

| | | |
|---|---|---|
| JP | 06-260391 | 9/1994 |
| JP | 08-021705 | 1/1996 |
| JP | 11-016827 | 1/1999 |

* cited by examiner

*Primary Examiner*—Christopher W Fulton
(74) *Attorney, Agent, or Firm*—Cowan, Liebowitz & Latman, P.C.

(57) ABSTRACT

A surface position measuring method wherein measurement light is obliquely projected onto a substrate surface and on the basis of a position of the detected measurement light and a predetected offset, the position of the substrate surface with respect to a direction of an optical axis of the projection optical system is measured, memorizing a first position of a point on the substrate while using a reference mark provided on a substrate stage, measuring the position of the measurement light as a first measurement position; rotating the substrate by 180 deg. in a plane perpendicular to the optical axis; memorizing a second position of the measurement point on the rotated substrate with reference to the reference mark; measuring the position of the measurement light as a second measurement position; and detecting of the offset at the measurement point on the basis of the first and second measurement position.

3 Claims, 15 Drawing Sheets

SURFACE POSITION MEASURING METHOD, EXPOSURE APPARATUS, AND DEVICE MANUFACTURING METHOD

FIELD OF THE INVENTION AND RELATED ART

This invention relates generally to surface position measurement for a substrate in an exposure apparatus which is usable in a lithographic process for manufacture of devices.

The manufacture of very fine semiconductor devices such as semiconductor memories and logic circuits and liquid crystal display devices, which is based on a lithographic process, uses a projection exposure apparatus. The projection exposure apparatus is arranged to project a circuit pattern formed on a reticle (mask) onto a wafer or the like through a projection optical system.

In such projection exposure apparatuses, due to increasing integration density of semiconductor devices, it is required that a circuit pattern of the reticle can be projected and transferred onto a wafer with higher resolving power. The smallest size (resolution) that can be transferred by a projection exposure apparatus is proportional to the wavelength of light used for the exposure, and it is inversely proportional to the numerical aperture (NA) of the projection optical system. For this reason, used light sources have been changed from super-high pressure Hg lamps to KrF excimer lasers or ArF excimer lasers having shorter wavelength. Eventually, F2 lasers are being practically used. As regards the light from super-high pressure Hg lamps, there are g-line (wavelength is about 436 nm) and i-line (wavelength is about 365 nm). On the other hand, the wavelength of the KrF excimer laser is about 248 nm and the wavelength of the ArF excimer laser is about 193 nm. The wavelength of the F2 laser is about 157 nm.

In addition to this, further enlargement of the exposure region has been required.

In order to meet these requirements, projection exposure apparatuses have been changed from step-and-repeat type exposure apparatuses, called a "stepper" and, currently, step-and-scan type exposure apparatuses called a "scanner" are being used prevalently. The stepper is an apparatus in which an exposure region of approximately square shape is simultaneously transferred to a wafer in a reduced scale. On the other hand, the scanner is an apparatus in which the exposure region has an oblong or arcuate slit-like shape and in which a reticle and a wafer are relatively scanned at a high speed, such that a large picture plane can be exposed with good precision.

In scanner type exposure apparatuses, in the exposure operation and just before a predetermined position on the wafer comes close to the exposure slit region, the surface position of the wafer at the predetermined position is measured by using surface position detecting means of a light oblique-incidence system. Then, at the moment at which the predetermined position of the wafer is just going to be exposed, the wafer surface is moved and brought into registration with the best exposure imaging position (best focus position).

Particularly, with regard to the lengthwise direction of the exposure slit (namely, the direction which is perpendicular to the scan direction), for measurements not only for the wafer surface position (focus) but also for the tilt of the wafer surface there are a plurality of measurement points defined in the exposure slit region. Such focus and tilt measuring method has been proposed in Japanese Laid-Open Patent Application, Publication No. H06-260391.

In recent years, the wavelength shortening of used exposure light as well as enlargement of the NA of the projection optical systems have been advanced considerably. As a result, the depth of focus is becoming very small and the precision for registering the wafer surface, to be exposed, with the best imaging plane, that is, the focus precision, is becoming more and more severe. Particularly, in these days, a measurement error of the surface position detecting means which is attributable to unevenness in coarseness/fineness of a pattern formed on the wafer or unevenness in thickness of a resist material applied onto the wafer surface cannot be disregarded any more.

First of all, with regard to the measurement error that can be caused by unevenness of resist thickness, there is a surface level difference (surface step) produced around a peripheral circuit pattern or a scribe line, which difference might be considered large for focus measurement, although it may be small as compared with the depot of focus. Due to this surface level difference, the surface of the applied resist material would have a large tilt angle such that reflection light therefrom to be detected by the surface position detecting means would shift from the regular reflection angle because of reflection or refraction.

On the other hand, with regard to the measurement error that can be caused by unevenness in coarseness/fineness of a pattern formed the wafer, as shown in FIG. 14, there would be a difference in reflectance of the wafer between a coarse pattern region and a dense or fine pattern region. As a result of this, the reflection intensity of reflected light to be detected by the surface position detecting means changes which would result in an asymmetric shape of a signal waveform (B) as compared with a correct signal waveform (A) that could be obtained if there is no unevenness of pattern coarseness/fineness. This means that, if the signal is processed in accordance with gravity-center processing, for example, a measurement error (offset) is produced there.

In an attempt to reducing the measurement error of the wafer surface position detecting means such as described above, the followings have been proposed.

Japanese Laid-Open Patent Application, Publication No. H08-21705 proposes a method in which the sample is rotated by 180 deg. about the measurement position and an average of measured values is used. Japanese Laid-Open Patent Application, Publication No. H11-16827 proposes a method in which the same measurement position is measured by using two optical systems and from mutually opposite directions so as to cancel any measurement error.

However, with simple rotation as proposed by Japanese Laid-Open Patent Application, Publication No. H08-21705, there is a possibility that the wafer surface position with respect to the optical axis direction of the projection optical system (hereinafter, this will be referred to also as "Z height") as well as the wafer tilt are not reproduced, before and after the rotation. In such occasion, since the measurement value may contain not only a wafer process error but also a focus error and tilt error, it would be unable to calculate the wafer process error accurately.

In the case of Japanese Laid-Open Patent Application, Publication No. H11-16827, although it may be free from the problem of focus and tilt error involved in the method proposed by Japanese Laid-Open Patent Application, Publication No. H8-21705, two optical systems have to be used there. Hence, it leads to an increased cost of the apparatus.

SUMMARY OF THE INVENTION

It is accordingly an object of the present invention to provide a unique and improved technique for measurement of a surface position of a substrate by which a detection error which might be induced by the substrate can be removed or reduced.

In accordance with an aspect of the present invention, there is provided a surface position measuring method, applied to an exposure apparatus for exposing a surface of a substrate to light through a projection optical system, for measuring a position of the surface of the substrate, wherein measurement light is obliquely projected onto the substrate surface and the measurement light on that surface is detected and wherein, on the basis of a position of the detected measurement light and a predetected offset, the position of the substrate surface with respect to a direction of an optical axis of the projection optical system is measured, said method comprising steps of: memorizing, as a first position, a position of a measurement point on the substrate while using, as a reference, a reference mark provided on a substrate stage which is configured to hold and move the substrate; measuring, in accordance with information concerning the memorized first position and in relation to the measurement point, the position of the measurement light as a first measurement position; rotating the substrate by 180 degrees in a plane perpendicular to the optical axis; memorizing, as a second position, a position of the measurement point on the rotated substrate with reference to the reference mark; measuring, in accordance with information concerning the memorized second position and in relation to the measurement point, the position of the measurement light as a second measurement position; and detecting the offset at the measurement point, on the basis of the first measurement position and the second measurement position.

In accordance with another aspect of the present invention, there is provided an exposure apparatus including a projection optical system, for exposing a surface of a substrate to light through the projection optical system, said apparatus comprising: a detecting system configured to obliquely project measurement light onto the substrate surface to detect the measurement light on that surface, and also to measure the position of the substrate surface with respect to a direction of an optical axis of the projection optical system on the basis of a position of the detected measurement light and a predetected offset; a substrate stage configured to hold and move the substrate; and a controller which is configured (i) to memorize, as a first position, a position of a measurement point on the substrate while using, as a reference, a reference mark provided on said reference stage and to control operations of said detecting system and said substrate stage in accordance with information concerning the memorized first position, so as to measure, in relation to the measurement point, the position of the measurement light as a first measurement position, (ii) to control the operation of said substrate state so as to rotate the substrate by 180 degrees in a plane perpendicular to the optical axis, (iii) to memorize, as a second position, a position of the measurement point on the rotated substrate with reference to the reference mark and to control the operations of said detecting system and said substrate stage in accordance with information related to the memorized second position, so as to measure, in relation to the measurement point, the position of the measurement light as a second measurement position, and (iv) to detect the offset at the measurement point, on the basis of the first measurement position and the second measurement position.

In accordance with a further aspect of the present invention, there is provided a method of manufacturing a device, said method comprising steps of: exposing a substrate to light using an exposure apparatus as recited above; developing the exposed substrate; and processing the developed substrate to manufacture the device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 13:
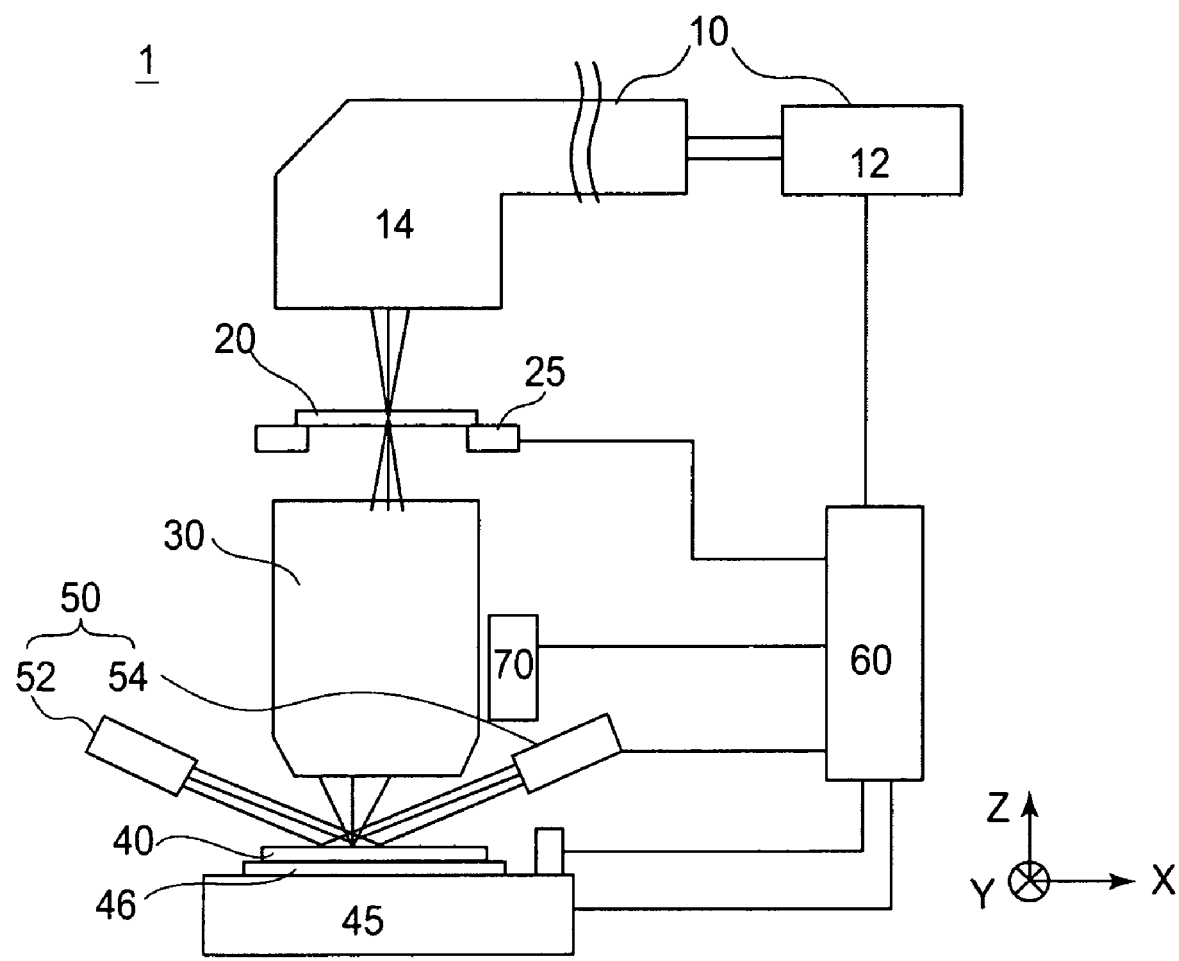
FIG. 13 is a schematic view of a general structure of a semiconductor exposure apparatus according to an embodiment of the present invention.
Figure 14:
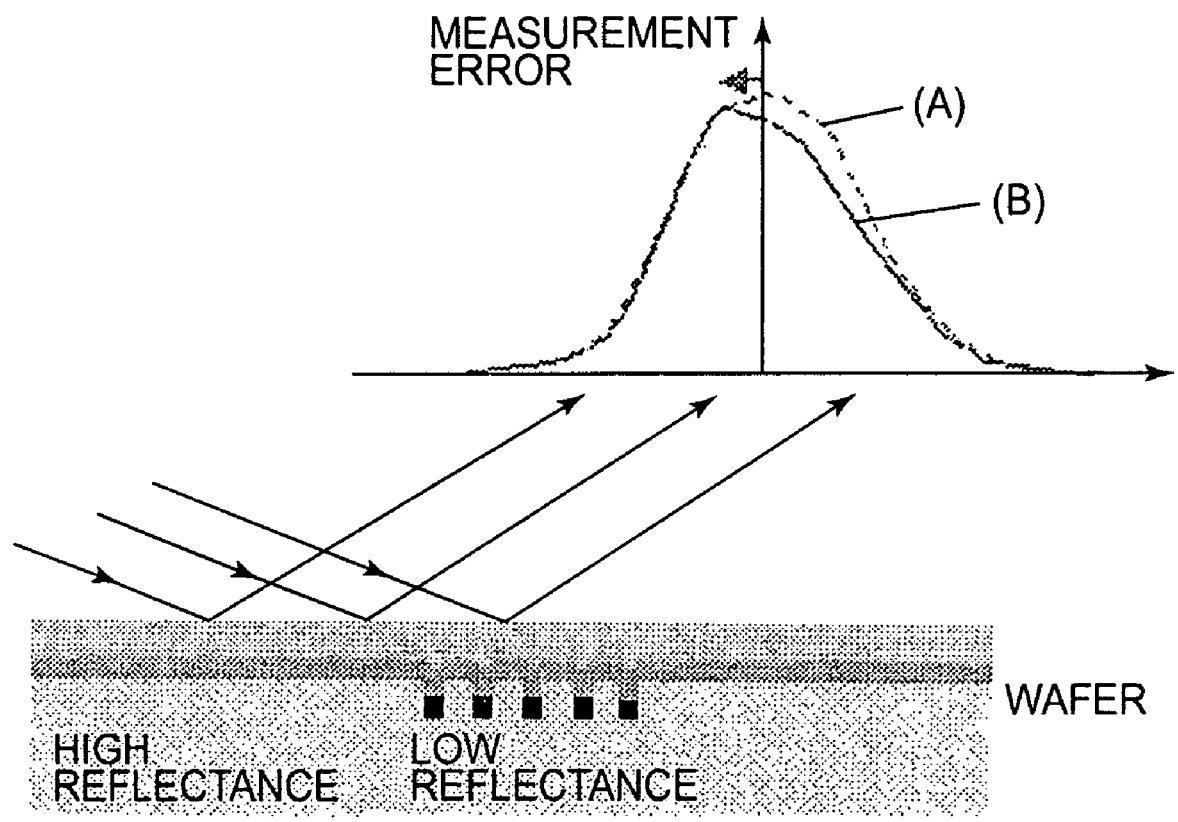
FIG. 14 is a schematic view for explaining a measurement error resulting from a difference in reflectance of a pattern on a wafer.

FIG. 13 is a schematic and diagrammatic view showing a general structure of an exposure apparatus prepared in accordance with an aspect of the present invention.

In this example, the exposure apparatus 1 is a projection exposure apparatus arranged to transfer a circuit pattern formed on a reticle 20 onto a wafer 40 in accordance with a step-and-scan method. Such exposure apparatus is very effective for a lithographic process of less-than-submicron order or less-than-quarter-micron order resolution. As shown in FIG. 13, the exposure apparatus 1 includes an illumination system 10, a reticle stage 25 on which a reticle 20 is to be mounted, a projection optical system 30, and a wafer stage 45 on which a wafer 40 is to be mounted. The exposure apparatus further includes a focus tilt detecting system 50, an alignment detecting system 70 and a control unit 60.

The control unit 60 has a CPU and a memory, for example, and it is electrically connected to the illumination system 10, the reticle stage 25, the wafer stage 45, the focus detecting system and the alignment detecting system 70 to control various operations in the exposure apparatus 1.

The illumination system 10 functions to illuminate a reticle 20 having formed thereon a circuit pattern to be transferred, and it includes a light source unit 12 and an illumination optical system 14.

The light source unit 12 uses laser light. An ArF excimer laser having a wavelength of about 193 nm or a KrF excimer laser having a wavelength of about 248 nm may be used for the light source unit, for example. However, the type of light source is not limited to excimer lasers. An $F_2$ laser having a wavelength of about 157 nm or EUV (Extreme Ultraviolet) light having a wavelength of not greater than 20 nm may be used.

The illumination optical system 14 is an optical system for illuminating a surface to be illuminated, with use of a light beam emitted from the light source unit 12. In this embodiment, it functions to shape the light beam into an exposure slit of predetermined shape best suited to the exposure, and illuminates the reticle 20 with it. The illumination optical system 14 includes a lens, a mirror, an optical integrator, a stop, and so on. As an example, the components of this illumination optical system are disposed in an order of: condenser lens, fly's eye lens, aperture stop, condenser lens, slit and imaging optical system. The illumination optical system 14 can be used either with axial light or with abaxial light. The optical integrator includes a fly's eye lens or an integrator that can be provided by combining a pair of cylindrical lens array plates (or lenticular lens means). However, this may be replaced by an optical rod or a diffractive element.

The reticle 20 is made of quartz, for example, and a circuit pattern to be transferred is formed thereon. The reticle is placed on the reticle stage 25 and is moved thereby. Diffraction light coming from the reticle 20 goes through the projection optical system 30 and it is projected on the wafer 40. The reticle 20 and the wafer 40 are placed in an optically conjugate relationship. By scanning the reticle 20 and the wafer 40 at a speed ratio corresponding to the reduction projection magnification, the pattern of the reticle 20 is transferred onto the wafer 40. The exposure apparatus 1 is provided with reticle detecting means 70 of light oblique incidence system. The position of the reticle 20 is detected by the unshown reticle detecting means, such that the reticle can be placed at a predetermined position.

The reticle stage 25 supports the reticle 20 through a reticle chuck (not shown). The reticle stage is connected to a moving mechanism (not shown). The unshown moving mechanism includes a linear motor, for example, and it functions to move the reticle 20 by driving the reticle stage 25 in an X-axis direction, a Y-axis direction, a Z-axis direction, and rotational directions around these axial directions.

The projection optical system 30 has function for imaging a light beam from an object plane upon an image plane, and it serves to image the diffraction light from the pattern formed on the reticle 20 upon the wafer 40.

The wafer 40 is a workpiece to be processed, and a photoresist is applied onto a substrate. In this embodiment, the wafer is also an object whose position is to be detected by the focus tilt detecting system 50.

The alignment optical system 70 is provided to detect any X-Y positional deviation of the wafer 40. In the illustrated example, this alignment optical system is of off-axis type and is disposed on an optical axis which is separate from the optical axis of the exposure projection optical system, and non-exposure light is used there.

The wafer stage 45 supports the wafer 40 through a wafer chuck 46. At least three wafer chuck marks are formed on the wafer chuck such that Z height information can be detected by means of the focus tilt detecting system 50 while X-Y positional information can be detected by means of the alignment optical system. Similarly to the reticle stage 25, the wafer stage 45 uses a linear motor to move the wafer 40 and the wafer chuck 46 in the X-axis direction, the Y-axis direction, the Z-axis direction and rotations directions around these axial directions. The position of the reticle stage 25 as well as the position of the wafer stage 45 are monitored by means of a laser interferometer, for example, so that these stages can be driven at a constant speed ratio.

The reticle stage 25 and the projection optical system 30 are provided on a barrel base (not shown) which is supported, through a damper, on a base frame mounted on a floor or the like, for example.

Next, the focus tilt detecting system 50 in this embodiment will be explained.

The focus tilt detecting system functions to detect positional information related to the surface position (Z-axis direction) of the wafer 40 during exposure, by use of an optical measuring system. In this embodiment, it uses a detection method in which a slit-like mark for focus detection is projected onto a wafer. More specifically, a slit-like mark for focus detection is projected onto the surface of the wafer 40 at a large incidence angle by means of a focus detecting projection optical system 52. The mark projected image is re-imaged upon a photoelectric converting element such as CCD, for example, by means of a light receiving optical system 54. Then, by using a signal waveform from the photoelectric converting element, the surface position of the wafer is detected.

Then, with regard to one measurement point in a certain shot region upon the wafer 40, a plurality of marks are formed along the lengthwise direction of the exposure slit, and mark images of these marks are re-images upon separate photoelectric converting elements, respectively, such that focus measurement is carried out.

Furthermore, with regard to plural sample shots on the wafer 40, focus measurement is carried out using plural marks mentioned above, with a few-millimeter pitch in the scan direction. By statistically processing the focus measurement results, the surface position of the wafer (focus and tilt) is detected.

Embodiment 1

Figure 1:
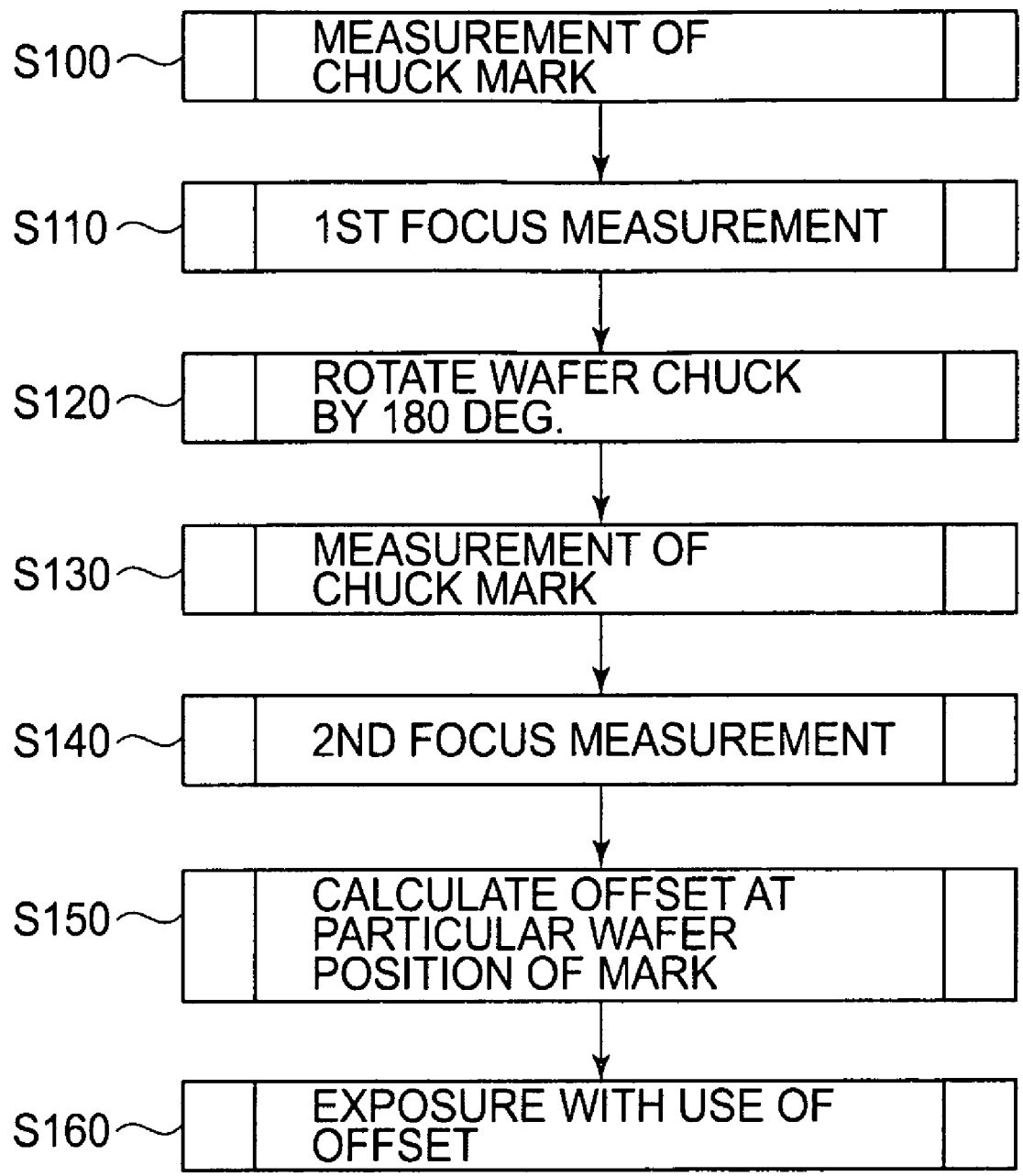
FIG. 1 is a flow chart for explaining a first embodiment of the present invention.

FIG. 1 is a flow chart for explaining a first embodiment of the present invention.

The first embodiment of the present invention is an example wherein there is a single focus-detecting slit-like mark (mk) being projected on a wafer.

As a wafer is loaded and placed on a wafer chuck, first, at step S100, with regard to three chuck marks provided on the wafer chuck, the Z height as well as the X and Y positions of these marks are measured.

Figure 2:
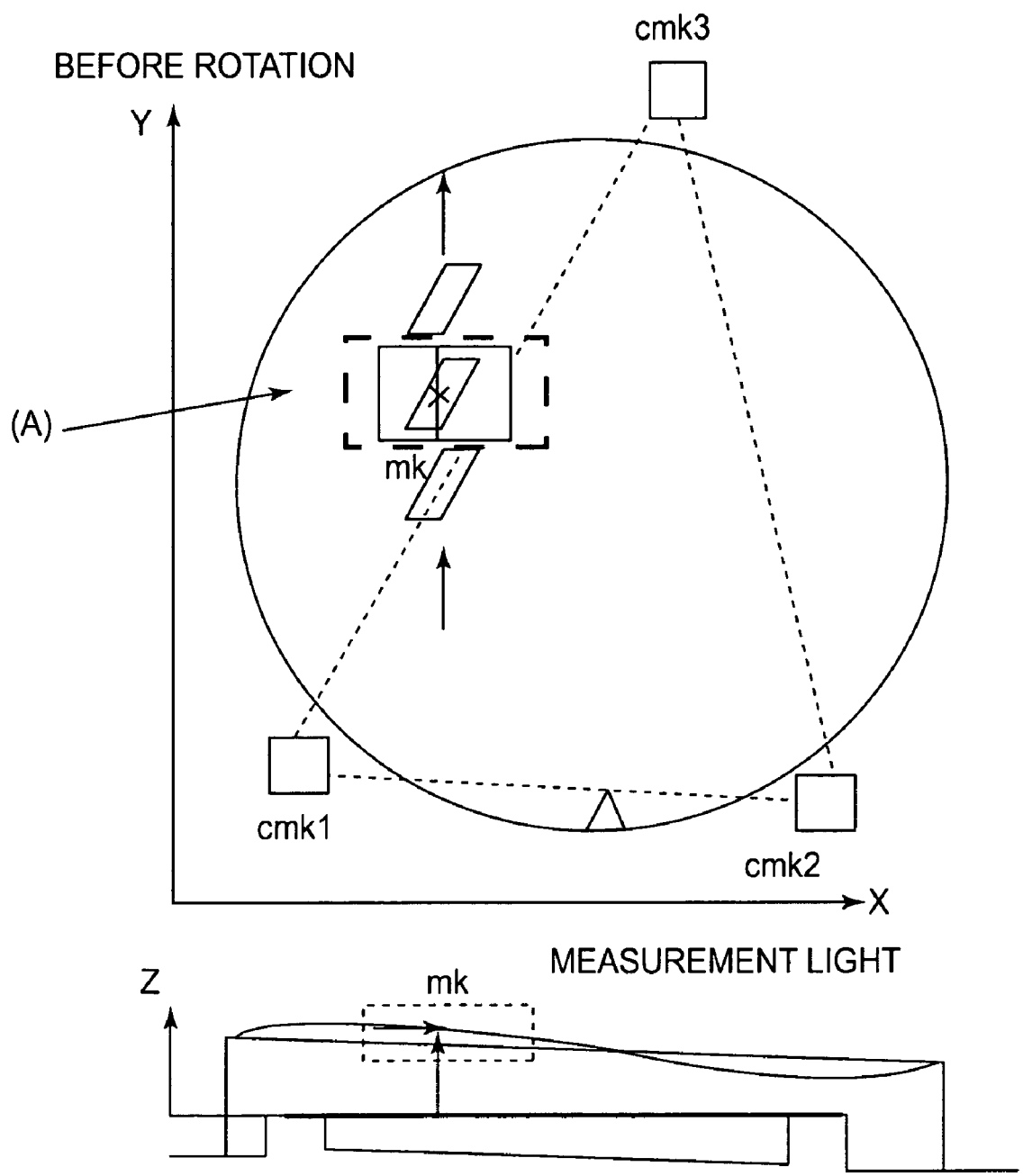
FIG. 2 is a schematic view for explaining the first embodiment in regard to an X-Y plane and a Z direction.

FIG. 2 is a schematic view for explaining the operation in this embodiment, with reference to the X-Y plane and the Z direction. At step S100 mentioned above, the X-Y position measurement and the Z-height measurement are carried out with regard to the three chuck marks shown at cmk1, cmk2 and cmk3 in FIG. 2, and the plane of the chuck marks is determined.

The reason for measuring these chuck marks here is that, in order to determine a reference for the X-Y position, it is necessary to use a mark without a wafer process error.

Subsequently, at step S101 in FIG. 1, first focus measurement using the mark mk is carried out in order to assure that the plane of the chuck marks and the running plane of the stage are registered with each other. Here, this first focus measurement is normally carried out to the wafer sample shots, at a few-millimeter pitch in the scan direction.

Figure 3A:
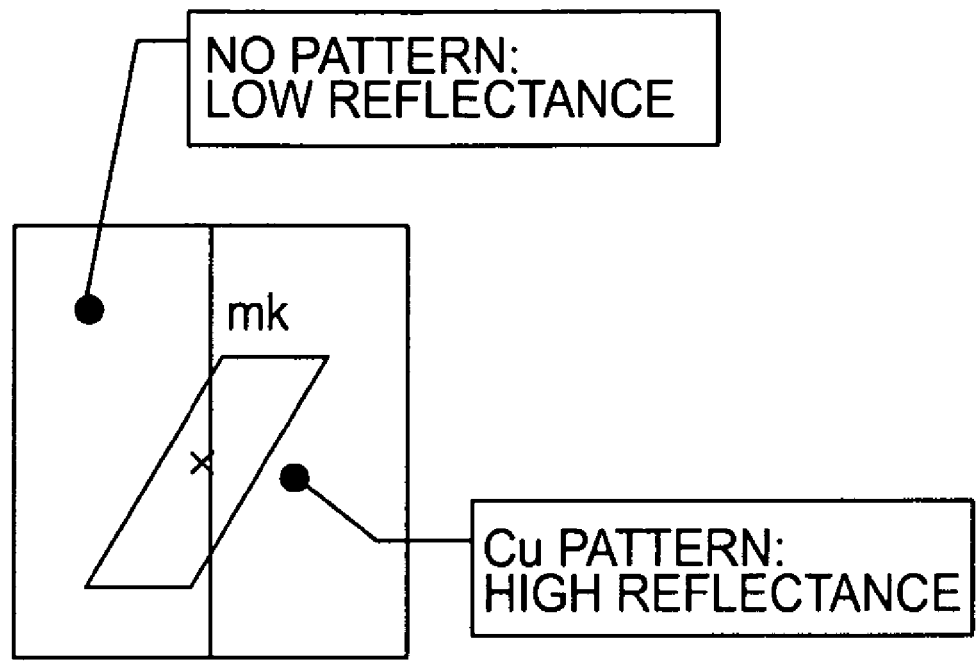
FIGS. 3A and 3B are schematic views for explaining details around a mark mk in FIG. 2.
Figure 3B:
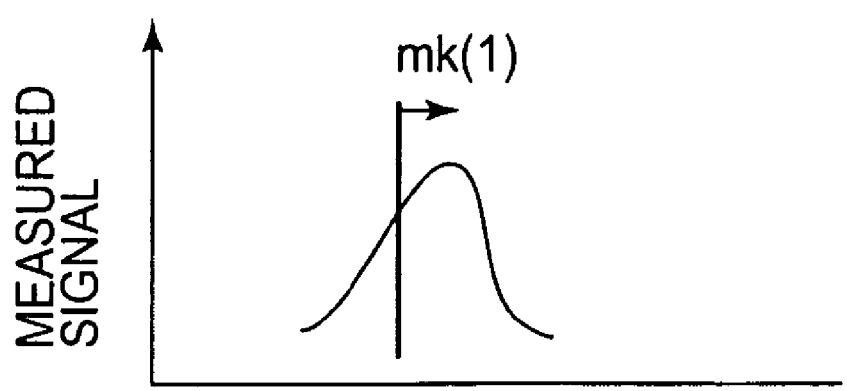

FIG. 3A illustrates details around the mark mk at (A) of FIG. 2 in the first focus measurement. This is an example wherein, with regard to the mark mk, the backing pattern of the wafer has a lower reflectance at the left-hand side thereof as viewed in the drawing, while it has a higher reflectance at the right-hand side thereof as viewed in the drawing. In this case, the focus measurement signal of the mark mk obtainable on the photoelectric converting element has a higher signal intensity corresponding to the higher-reflectance region and a lower signal intensity corresponding to the lower-reflectance region. Thus, a signal waveform such as shown in FIG. 3B is produced. Here, if the amount of deviation from the reference height is denoted by Z and the error resulting from the wafer process is denoted by $\Delta$, the focus measured value mk(1) can be expressed by an equation (1) below. It should be noted here that, in the description to be made hereinafter, numeral 1 in parentheses following the reference mk is use to refer to "before rotation", while numeral 2 in parentheses is used to refer to "after rotation".

$$mk(1)=Z+\Delta \quad (1)$$

Subsequently, at step S120 in FIG. 1, the wafer is rotated by 180 degrees and, then, at step S130, the heights and X-Y positions of the chuck marks are measured again.

Figure 4:
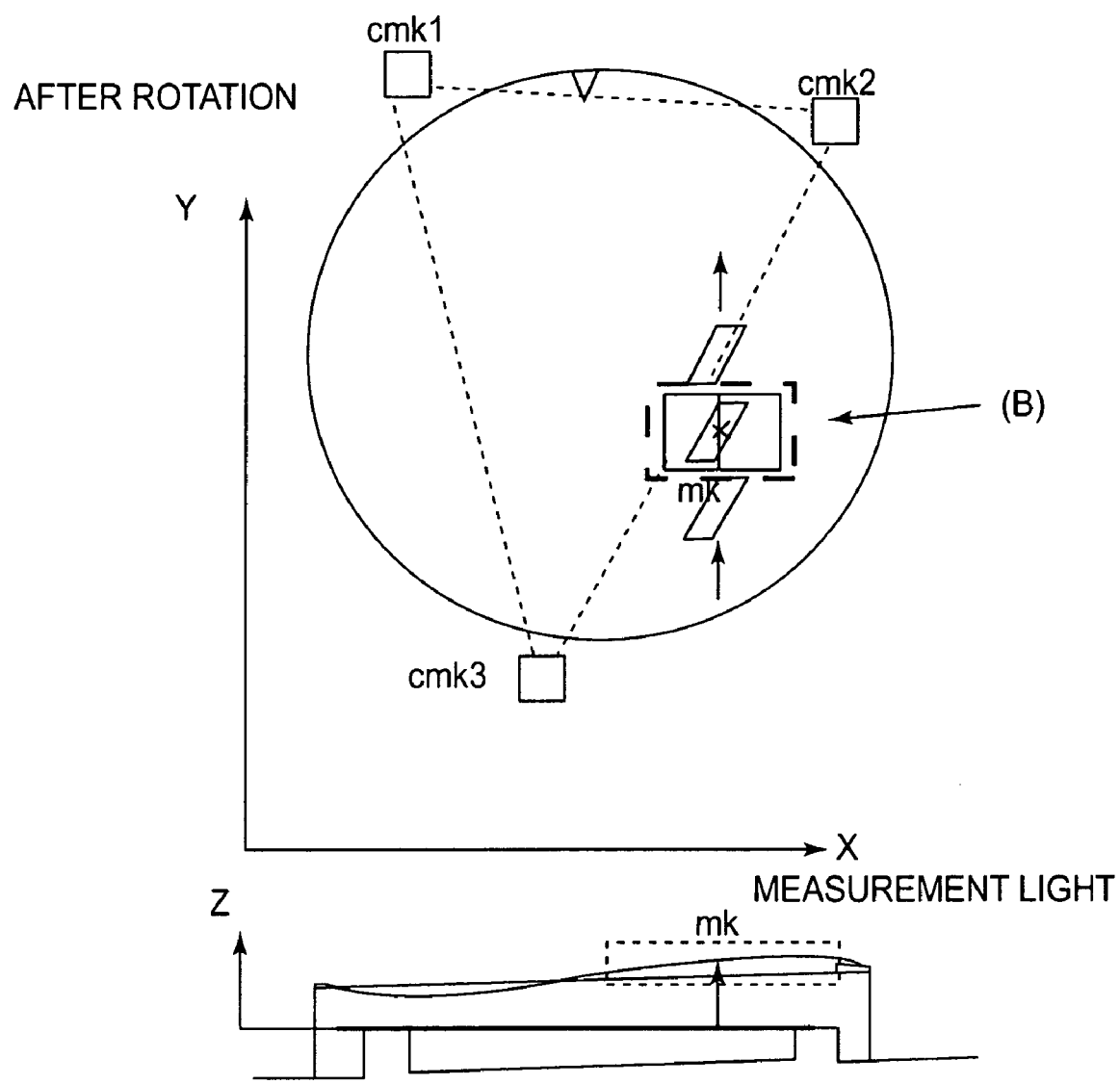
FIG. 4 is a schematic view for explaining the operation after wafer rotation in the first embodiment, in regard to the X-Y plane and the Z direction.

FIG. 4 is a schematic view for explaining the operation after the wafer rotation, with reference to the X-Y plane and the Z direction.

At step S130 mentioned above, like step S110, with regard to the chuck marks cmk1, cmk2 and cmk3, the X-Y position measurement and the Z-height measurement are carried out to determine the plane of the chuck marks.

After this, at step S140 in FIG. 1, an alignment operation is carried out so that, with respect to each of the positions on the wafer surface having been measured by the first focus measurement, the X-Y position is correctly aligned and that, with regard to the Z height, the stage running is registered with the plane of the chuck marks. Then, while keeping this state, second focus measurement is carried out.

In this embodiment, the X-Y position must be accurately registered between the first focus measurement position and the second focus measurement position. For accurate registration of the X-Y position, first, the X-Y position after the first focus measurement is carried out may be memorized on the basis of the chuck mark reference and, subsequently, after the wafer rotation, the X-Y position may be retrieved on the basis of the same chuck mark reference.

Figure 5A:
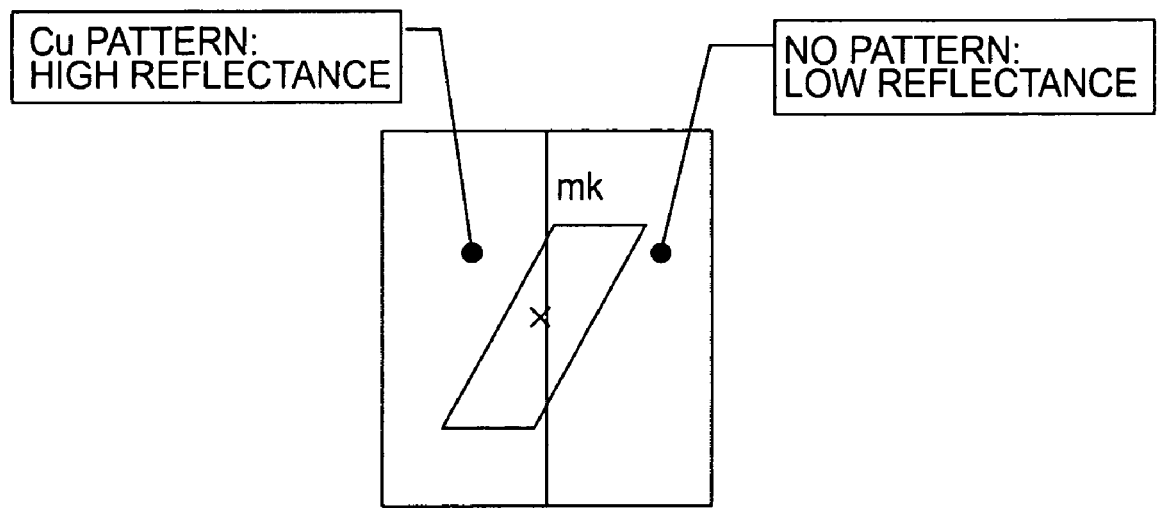
FIGS. 5A and 5B are schematic views for explaining details around a mark mk in FIG. 4.
Figure 5B:
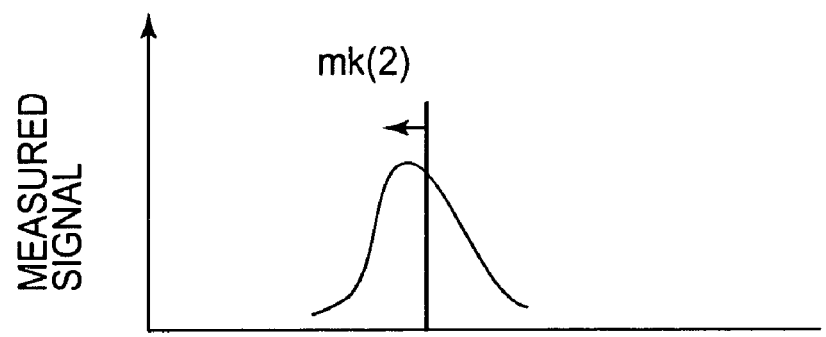

FIG. 5A illustrates details around the mark mk at (B) of FIG. 4 in the focus measurement. The reflectance of the backing pattern of the wafer is inverted as compared with that of FIG. 3A, and it is higher at the left-hand side as viewed in the drawing and it is lower at the right-hand side as viewed in the drawing. Thus, the focus measured signal of the mark mk upon the photoelectric converting element would be such as shown in FIG. 5B, and the difference in signal intensity due to the reflectance of the backing pattern is inverted as compared with that before the wafer rotation. It follows from the above that the focus measured value mk(2) can be expressed by an equation (2) below and, as compared with equation (1), the error a due to the wafer process takes a different sign.

$$mk(2)=Z-\Delta \quad (2)$$

Subsequently, at step S150 in FIG. 1, by using mk(1) and mk(2), a deviation Z from the reference height and a wafer process error $\Delta$ at each of the positions on the wafer measured by the mark mk are calculated in accordance with equation (3) below.

$$\begin{cases} Z = \dfrac{mk(1)+mk(2)}{2} \\ \Delta = \dfrac{mk(1)-mk(2)}{2} \end{cases} \quad (3)$$

Finally, at step S160 in FIG. 1, while using the wafer process error $\Delta$ as an offset, an actual exposure of the wafer is carried out. Namely, during actual exposure, at each wafer position the wafer process error $\Delta$ is subtracted from the first-focus-measurement measured value. In accordance with this procedure, the wafer surface position can be detected while the influence of wafer process error is reduced considerably.

Embodiment 2

Figure 6:
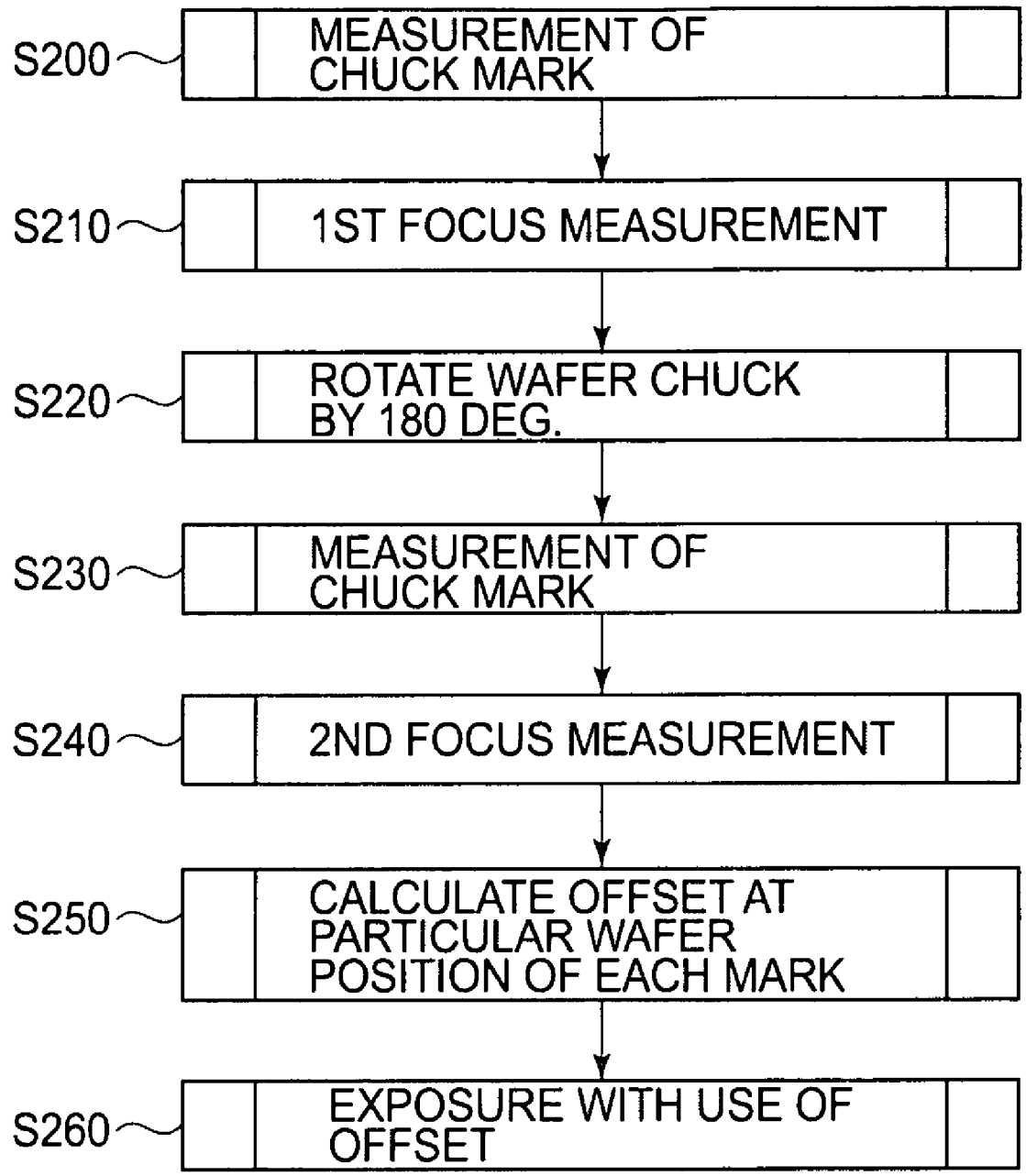
FIG. 6 is a flow chart for explaining a second embodiment of the present invention.

FIG. 6 is a flow chart for explaining a second embodiment of the present invention.

The second embodiment is an example wherein a plurality of focus-detecting slit-like marks mk1, mk2 and mk3 are projected upon a wafer.

As a wafer is loaded and placed on a wafer chuck, first, at step S200, with regard to at least three chuck marks provided on the wafer chuck, the Z height as well as the X and Y positions of these marks are measured.

Figure 7:
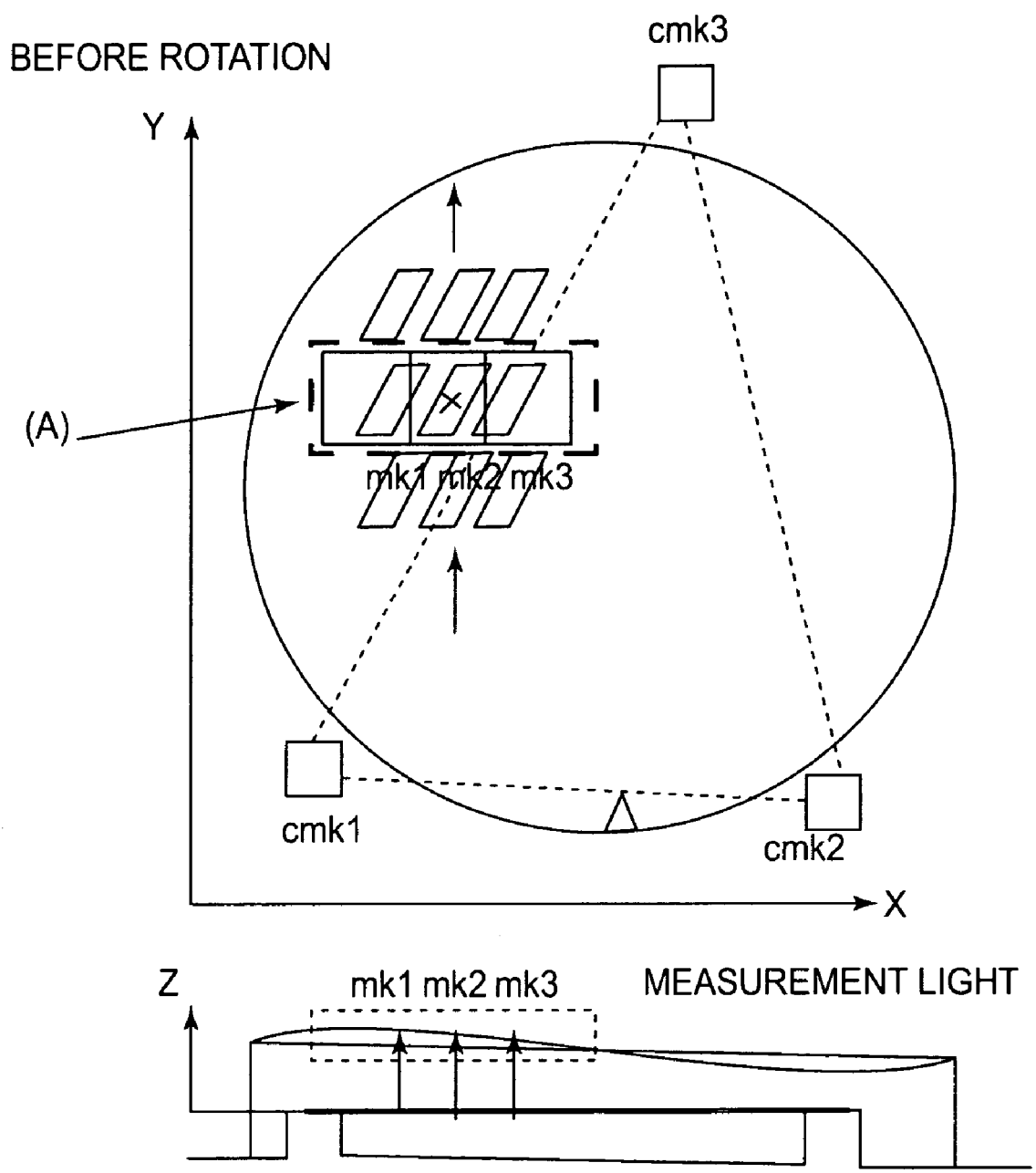
FIG. 7 is a schematic view for explaining the second embodiment in regard to the X-Y plane and the Z direction.

FIG. 7 is a schematic view for explaining the second embodiment with reference to the X-Y plane and the Z direction. At step S200 mentioned above, the X-Y position measurement and the Z-height measurement are carried out with regard to the chuck marks shown at cmk1, cmk2 and cmk3 in FIG. 7, and the plane of the chuck marks is determined.

Figure 8A:
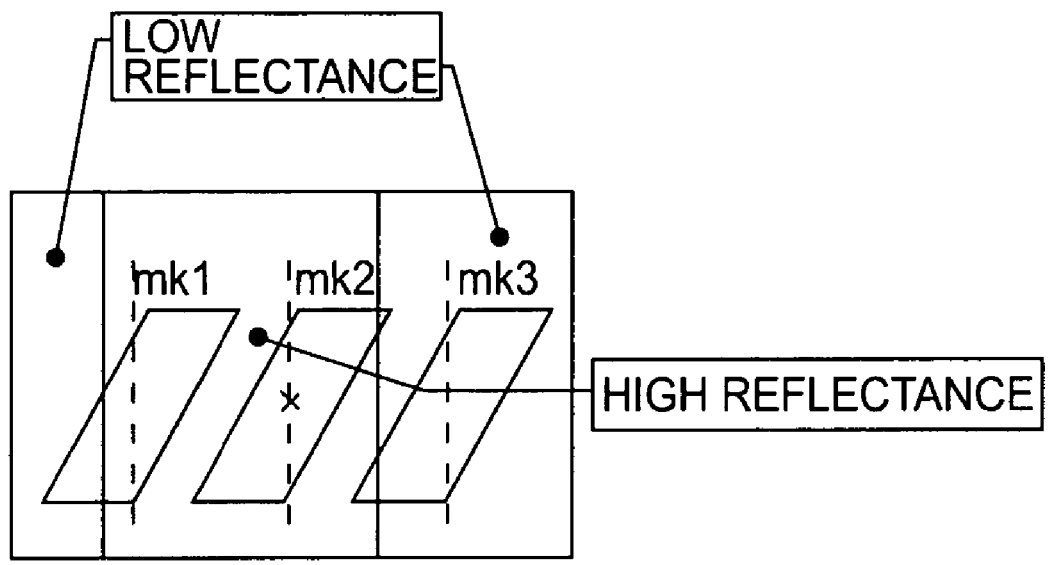
FIGS. 8A and 8B are schematic views for explaining details around a mark mk in FIG. 7.
Figure 8B:
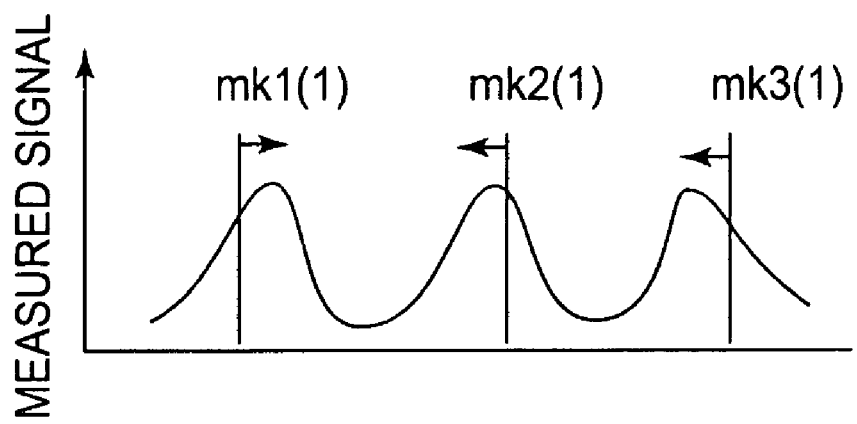

Subsequently, at step S201, first focus measurement using the marks mk1, mk2 and mk3 is carried out while scanningly moving the stage, in order to assure that the plane of the chuck marks and the running plane of the stage are registered with each other. FIG. 8A illustrates details around the marks mk1, mk2 and mk3 at (A) of FIG. 7 in the first focus measurement. The pattern underneath the marks has different reflectances due to the presence of logic elements, memory element, and scribe line elements and so on, such that the focus-measurement measured signal of the marks mk1, mk2 and mk3 upon the photoelectric converting element would be such as shown in FIG. 8B. It should be note here that in this embodiment these marks are disposed symmetrically with respect to the central position of all the marks. Here, if the amount of deviation of these marks from the mark reference height is denoted by Z1, Z2 and Z3, respectively, and the error resulting from the wafer process is denoted by Δ1, Δ2 and Δ3, respectively, the focus measured values mk(1), mk(2) and mk(3) can be expressed by an equation (4) below.

$$\begin{cases} mk1(1) = Z_1 + \Delta_1 \\ mk2(1) = Z_2 + \Delta_2 \\ mk3(1) = Z_3 + \Delta_3 \end{cases} \quad (1)$$

Subsequently, at step S220, the wafer is rotated by 180 degrees and, then, at step S230, the heights and X-Y positions of the chuck marks are measured again.

Figure 9:
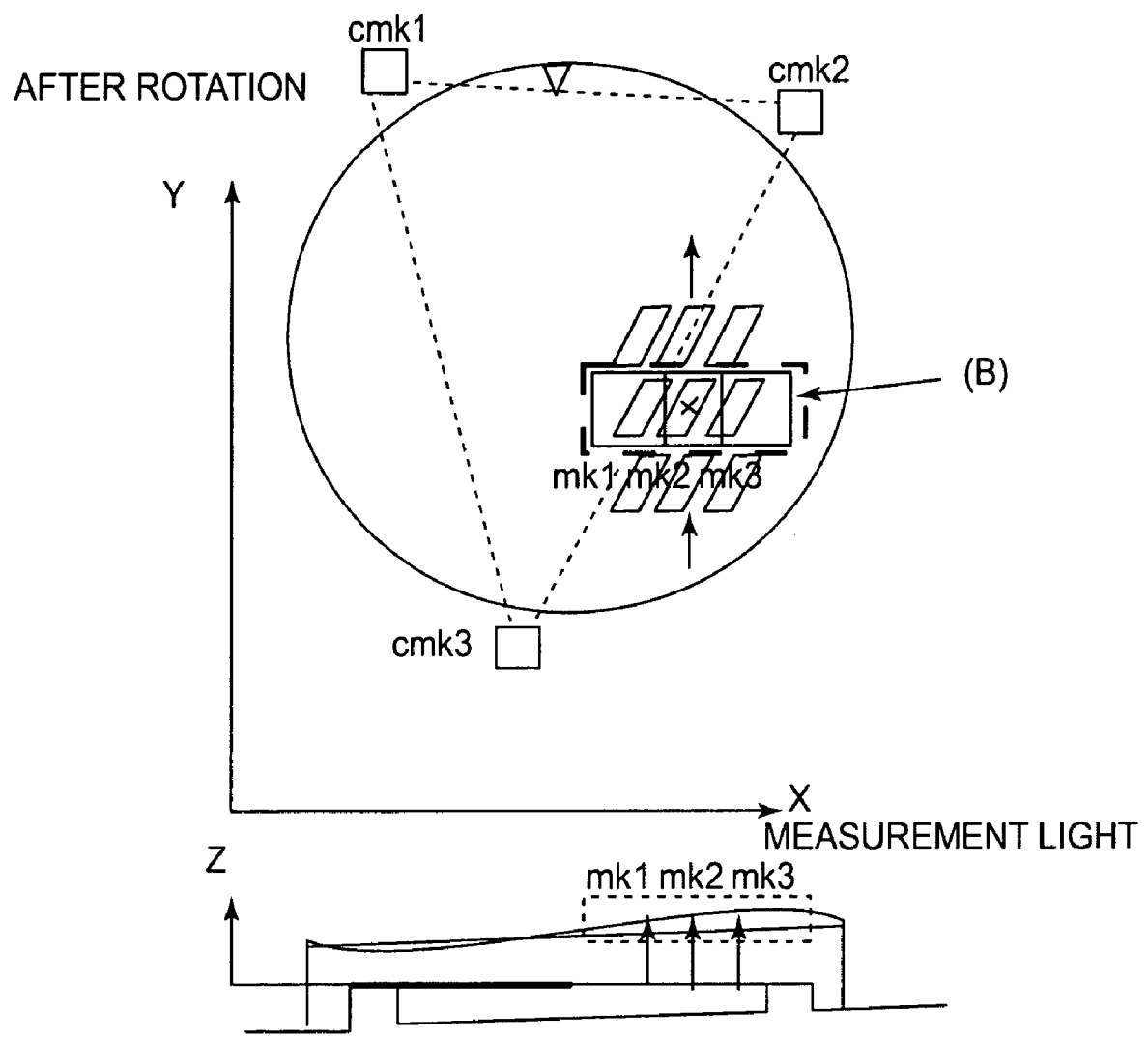
FIG. 9 is a schematic view for explaining the operation after wafer rotation in the second embodiment, in regard to the X-Y plane and the Z direction.

FIG. 9 is a schematic view for explaining the operation after the wafer rotation, with reference to the X-Y plane and the Z direction.

At step S230 mentioned above, like step S210, with regard to the chuck marks cmk1, cmk2 and cmk3, the X-Y position measurement and the Z-height measurement are carried out to determine the plane of the chuck marks.

After this, at step S240, wafer alignment operation is carried out so that, with respect to each of the positions on the wafer surface having been measured by the first focus measurement, the X-Y position of the center of all the mark (i.e., the point denoted by "x" inside the middle mark mk2 in FIG. 9) is correctly aligned and that, with regard to the Z height, the stage running is registered with the plane of the chuck marks. Then, while keeping this state, second focus measurement is carried out.

Figure 10A:
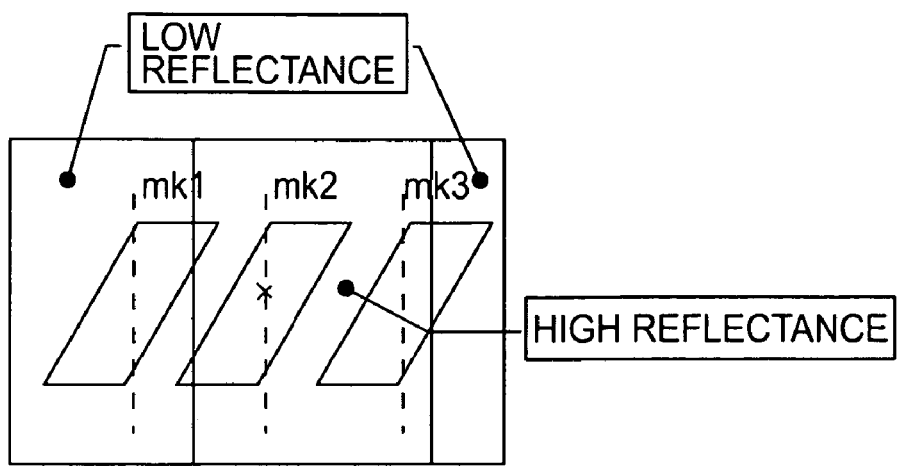
FIGS. 10A and 10B are schematic views for explaining details around marks mk1, mk2 and mk3 in FIG. 9.

FIG. 10A illustrates details around the marks mk1, mk2 and mk3 at (B) of FIG. 9 in the focus measurement. In the second embodiment the marks are disposed symmetrically with respect to the center position (at x inside the middle mark mk2) of all the marks, and this means that mark mk1 after the wafer rotation measures the same position as by mark mk3 before rotation. Namely, the deviation, to be measured, from the reference height is Z3. Further, the reflectance of the wafer backing pattern with respect to mark mk1 after rotation does correspond to an inversion of the reflectance of the pattern with respect to mark mk3 before rotation.

Similarly, mark mk3 after wafer rotation measures the same position as by mark mk1 before rotation, and the reflectance of the pattern with respect to mark mk3 after rotation corresponds to an inversion of the reflectance of the pattern with respect to mark mk1 before rotation.

Figure 10B:
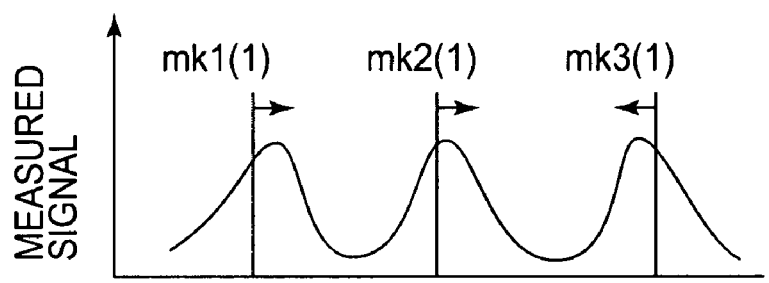

It is seen from the above that the focus measurement signal of the marks mk1, mk2 and mk3 upon the photoelectric converting element would be such as shown in FIG. 10B. The focus measured values mk1(2), mk2(2) and mk3(2) can be expressed by an equation (5) below and, as compared with equation (4), the errors Δ1, Δ2 and Δ3 due to the wafer process take a different sign.

$$\begin{cases} mk1(2) = Z_3 - \Delta_3 \\ mk2(2) = Z_2 - \Delta_2 \\ mk3(2) = Z_1 - \Delta_1 \end{cases} \quad (5)$$

Subsequently, at step S250 in FIG. 6, deviations Z1, Z2 and Z3 from the reference height and wafer process errors Δ1, Δ2 and Δ3 at each of the positions on the wafer measured by the marks mk1, mk2 and mk3 are calculated. From equations (4) and (5) above, these deviations and errors can be calculated in accordance with equations (6) and (7) below.

$$\begin{cases} Z_1 = \dfrac{mk1(1) + mk3(2)}{2} \\ Z_2 = \dfrac{mk2(1) + mk2(2)}{2} \\ Z_3 = \dfrac{mk3(1) + mk1(2)}{2} \end{cases} \quad (6)$$

$$\begin{cases} \Delta_1 = \dfrac{mk1(1) - mk3(2)}{2} \\ \Delta_2 = \dfrac{mk2(1) - mk2(2)}{2} \\ \Delta_3 = \dfrac{mk3(1) - mk1(2)}{2} \end{cases} \quad (7)$$

Finally, at step S260 in FIG. 6, while using the wafer process errors Δ1, Δ2 and Δ3 at each position on the wafer of the marks mk1, mk2 and mk3 as offsets, an actual exposure of the wafer is carried out. Namely, during actual exposure, at each position on the wafer of the marks mk1, mk2 and mk3, the wafer process error Δ1, Δ2 or Δ3 is subtracted from the first-focus-measurement measured value. In accordance with this procedure, the wafer surface position can be detected while the influence of wafer process error is reduced considerably.

Figure 11:
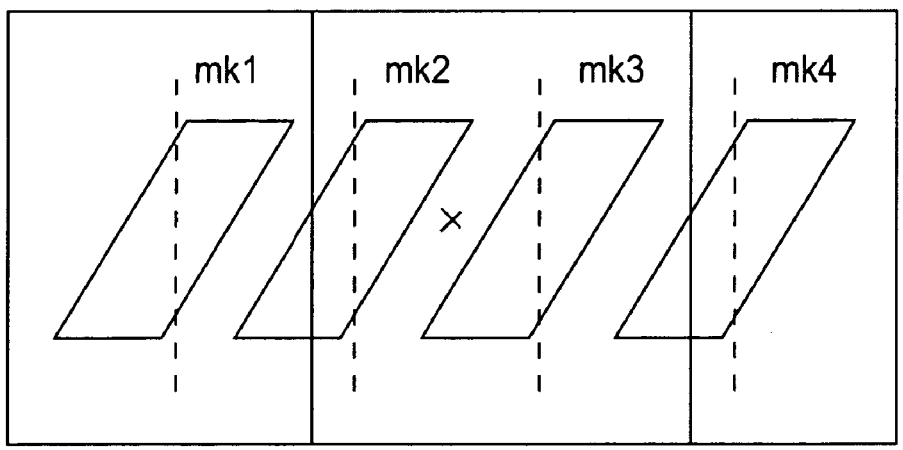
FIG. 11 is a schematic view for explaining placement of marks where in the present invention the focus detecting mark comprises four mark elements.

Although this embodiment has been described with reference to an example wherein an odd number (three) of marks are used, the present invention is not limited to this. An even number of marks may be used. For example, if there are four marks (mk1, mk2, mk3 and mk4 in this order), the center of these marks will be at "x" shown in FIG. 11 between the marks mk2 and mk3, and offsets Δ1 to Δ4 will be given by equation (8) below.

$$\begin{cases} \Delta_1 = \dfrac{mk1(1) - mk4(2)}{2} \\ \Delta_2 = \dfrac{mk2(1) - mk3(2)}{2} \\ \Delta_3 = \dfrac{mk3(1) - mk2(2)}{2} \\ \Delta_4 = \dfrac{mk4(1) - mk1(2)}{2} \end{cases} \quad (8)$$

Embodiment 3

A third embodiment of the present invention has a feature that the offset measurement based on the focus measurement described hereinbefore is carried out to a first wafer in a single lot. This is based on an assumption that the wafer process error due to a pattern is stable inside the same lot.

More specifically, focus measurement is carried out to a first wafer in one lot, and the offset of each mark at the scan position is detected. Then, for the second wafer and wafers following it, correction is made by using the offset data of the first wafer. With this procedure, the wafer surface position can be detected while the influence of wafer process error is reduced considerably and without a decrease of throughput.

Embodiment 4

A fourth embodiment of the present invention has a feature that the offset measurement based on the focus measurement described hereinbefore is carried out with respect to each wafer process. This is because, in each wafer process, the backing pattern of the wafer is different and, hence, it would be better to measure the offset resulting from the pattern each time.

More specifically, each time the wafer process is changed, the focus measurement is carried out to that wafer, and offsets of the marks at the respective scan positions are detected. For subsequent wafers in the same process, correction is made by using these offsets. With this procedure, the wafer surface position can be detected while the influence of wafer process error is reduced considerably and without a decrease of throughput.

Furthermore, the offset measurement based on focus measurement in this embodiment may be carried out with regard to each device pattern formed on the reticle.

Embodiment 5

The embodiments described hereinafter are all examples in which the focus measurement is carried out inside an exposure apparatus and the offset measurement is performed. However, the present invention is not limited to this. The offset measurement may be carried out by using a machine separate from the exposure apparatus.

More specifically, the offset measurement is carried out outside the exposure apparatus and, during actual exposure sequence, correction is made in accordance with the measured offset. With this procedure, the wafer surface position can be detected while the influence of wafer process error is reduced considerably and without a decrease of throughput.

Furthermore, the offset measurement in this embodiment may be made not only to a single exposure apparatus but also to plural exposure apparatuses inside the factory. In that occasion, the offset measurement may be carried out separately for these plural exposure apparatuses or, alternatively, if the machine difference of the exposure apparatuses can be made small, the same offset value may be applied to these exposure apparatuses.

Embodiment 6

A sixth embodiment of the present invention specifically concerns the structure of the focus detecting system in the second embodiment. In the second embodiment, the mark images are projected on the wafer at a large incidence angle. Because of this, there is a possibility that, among three marks mk1, mk2 and mk3, two marks mk1 and mk3 which are symmetrical with respect to the center position of the all the marks have different optical characteristics (defocus characteristics). If there is a difference in optical characteristic between the marks mk1 and mk3, the following problem may arise: that is, the first-focus-measurement measured value mk1(1) of the mark mk1 and the second-focus-measurement measured value mk3(2) of the mark mk3 include errors $\epsilon_1$ and $\epsilon_3$ due to the optical characteristics of the marks mk1 and mk3, as can be expressed by an equation (9) below.

$$\begin{cases} mk1(1) = Z_1 + \Delta_1 + \varepsilon_1 \\ mk3(2) = Z_1 - \Delta_1 + \varepsilon_3 \end{cases} \quad (9)$$

From equation (9), it is not possible to derive a wafer process error $\Delta_1$ canceling the errors $\epsilon_1$ and $\epsilon_3$.

Figure 12:
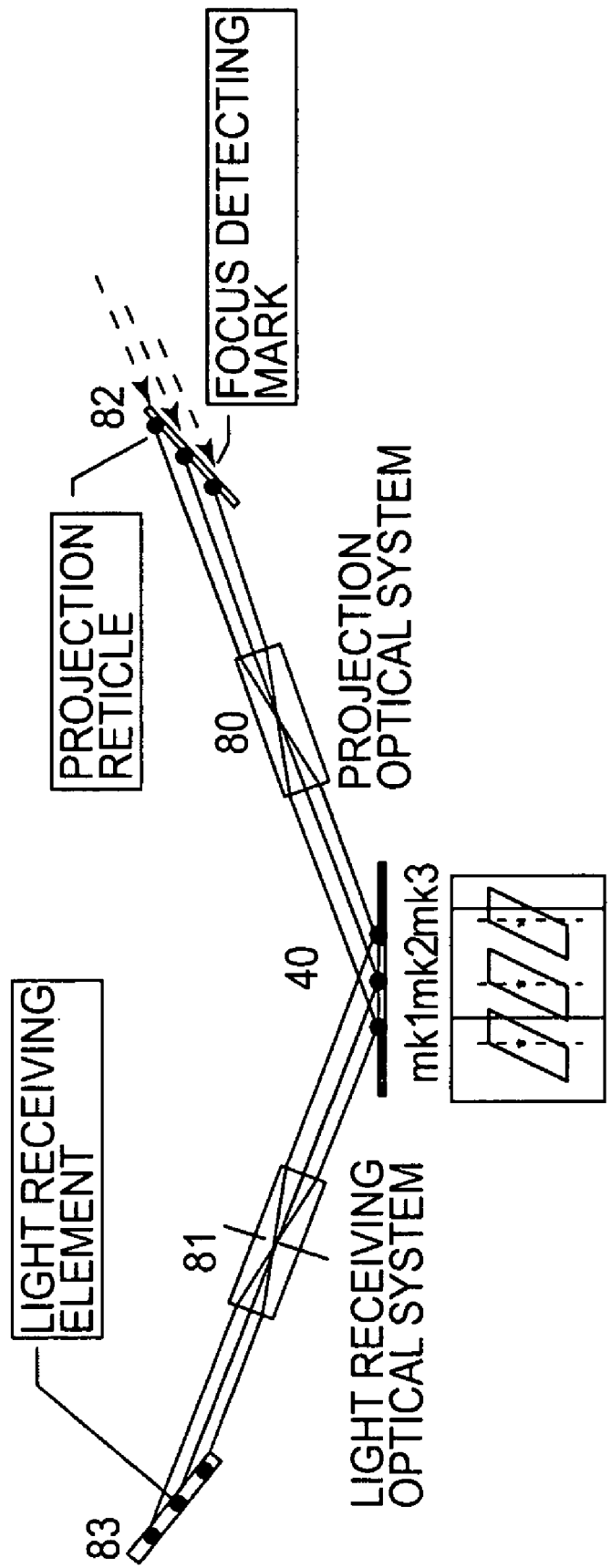
FIG. 12 is a schematic view of a focus detecting system according to an embodiment of the present invention.

If follows from this that preferably these marks have the same optical characteristic. In this embodiment, as shown in FIG. 12, the wafer surface 40 and the reticle surface 82 on which a plurality of focus detecting marks are formed are placed in a Scheinmpflug's condition with respect to the projection optical system 80. Additionally, with regard to the light receiving system 81 as well, the wafer surface 40 and the surface of the light receiving element 83 are placed in a Scheinmpflug's condition.

In accordance with the embodiment described above, even in such situation wherein a wafer process error due to a difference in wafer reflectance is produced, the wafer process error can still be reduced. Therefore, the precision of wafer surface position detection can be improved and, as a result, the yield can be increased significantly. Particularly, in accordance with this embodiment, the best focus of the wafer surface can be detected without exposure. Hence, it is very effective to shorten the TAT (Turn Around Time).

Embodiment 7

The embodiments described hereinbefore are examples of focus detecting system by which a wafer process error can be reduced with relatively low apparatus cost. On the other hand, this embodiment concerns an example which is effective, rather than the cost, to a case wherein every single wafer has to be measured because of increasing complicatedness of wafer processes. Furthermore, this embodiment is effective to a case wherein the exposure apparatus has such a structure that an exposure station and a measurement station are separated from each other, like a twin-stage structure, such that there is substantially no limitation in regard to the disposition of a focus detecting optical system in the measurement station.

More specifically, as in Japanese Laid-Open Patent Application, Publication No. H11-16827, one more light projecting system is disposed at the light receiving side while one more light receiving system is disposed at the light projecting side, in the structure of the preceding embodiment. Then, lights are projected in two directions onto a particular point on the wafer to perform the first and second focus measurements, and offsets are calculated.

This method-is more advantageous than rotating the wafer in the point of throughput and, obviously, similar advantageous effects as of the preceding embodiment are attainable thereby.

Embodiment 8

The embodiments described hereinbefore concern wafer surface position detection (focus and tilt). However, when the wafer chuck marks are measured, also the X-Y position is measured. Hence, by using an alignment optical system 70, marks (alignment marks) which are provided on the wafer for detection of X-Y positional deviation can be measured, with reference to the chuck mark. Namely, by using alignment measured values at the same measurement point of the wafer before and after the 180-degree rotation, any error (TIS) of the alignment optical system can be cancelled.

Embodiment of Device Manufacturing Method

Next, referring to FIGS. 15 and 16, an embodiment of a device manufacturing method which uses an exposure apparatus 1 described above, will be explained.

Figure 15:
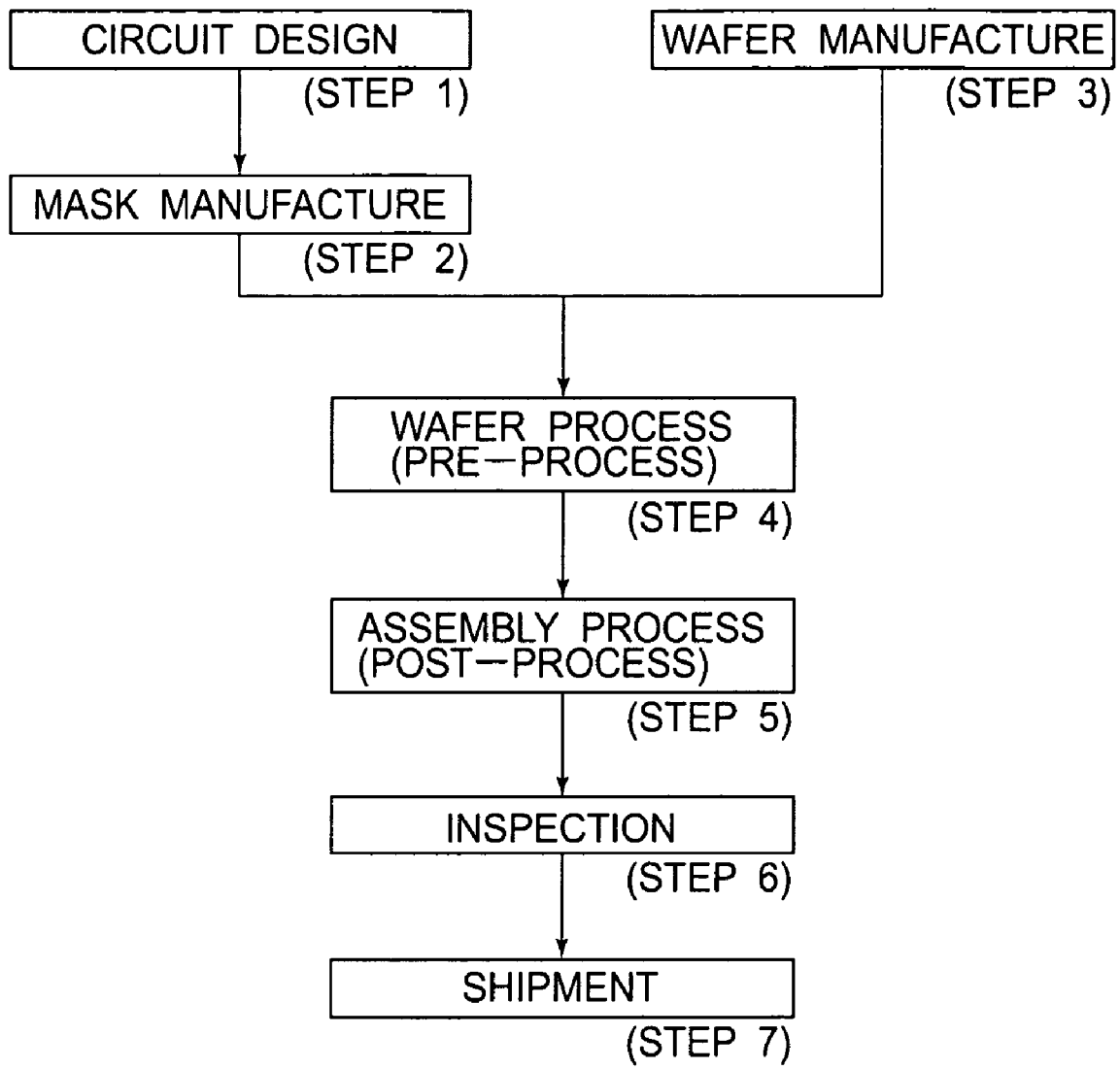
FIG. 15 is a flow chart for explaining the procedure of device manufacturing processes in an exposure apparatus according to an embodiment of the present invention.

FIG. 15 is a flow chart for explaining the procedure of manufacturing various microdevices such as semiconductor chips (e.g., ICs or LSIs), liquid crystal panels, or CCDs, for example. Here, the manufacture of semiconductor chips will be described as an example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 16:
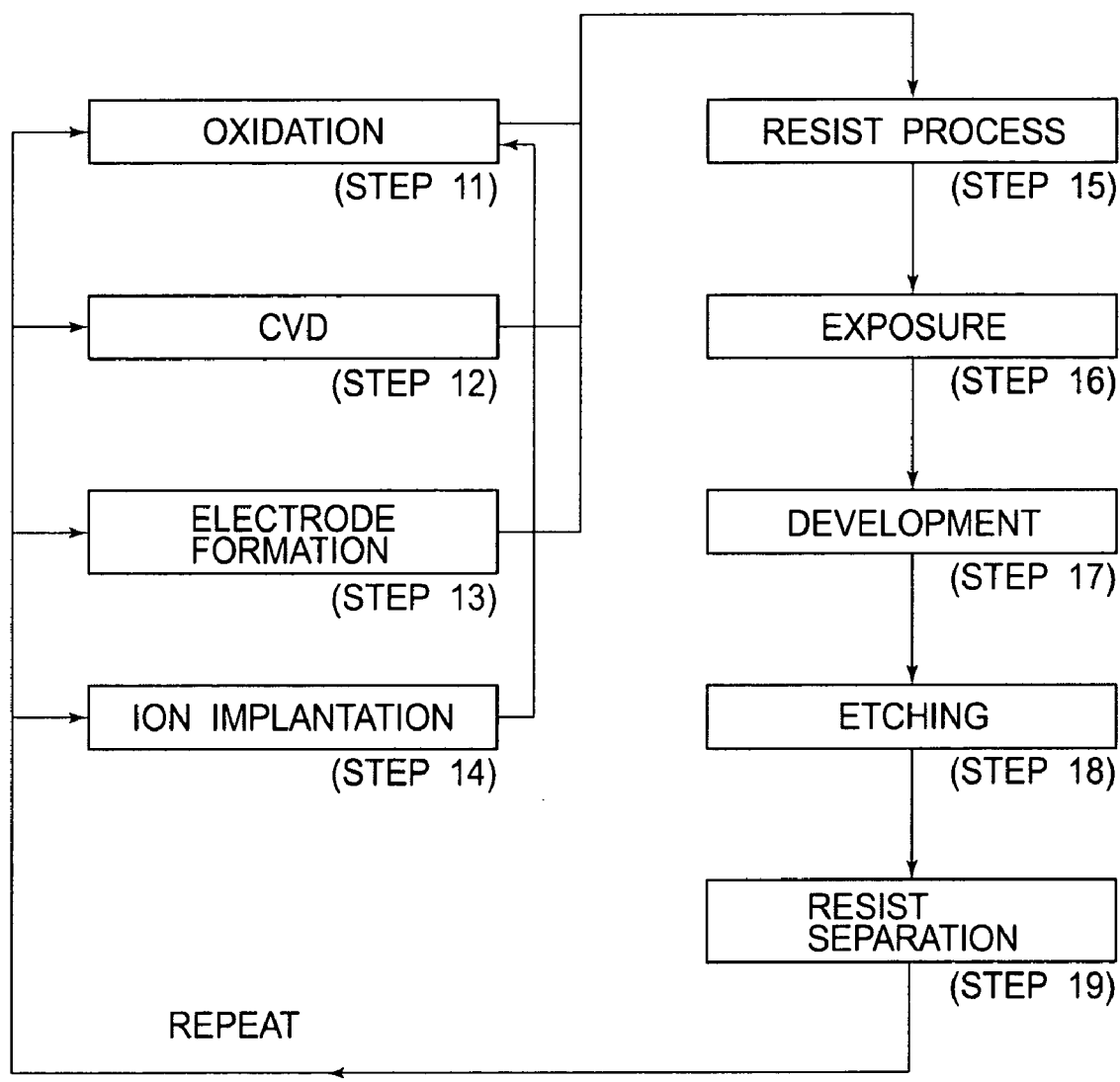
FIG. 16 is a flow chart for explaining details of a wafer process included in the procedure of FIG. 15.

FIG. 16 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the embodiments of the present invention as having been described hereinbefore, even if there is a difference in reflectance between portions on a substrate to be processed, due to coarseness/fineness of a pattern, accurate offset data can be detected. Therefore, in a projection exposure apparatus such as a scanner or a stepper, the precision of surface position detection for a workpiece substrate such as a wafer can be improved significantly and, as a result, the yield can be increased considerably. Particularly, when the present invention is applied to an exposure apparatus, the best focus of the wafer surface may be detected without exposure and, in that occasion, TAT can be reduced significantly.

The present invention can be embodied in various forms, and examples are as follows.

[1] A focus measuring method applied to an exposure apparatus in which a reticle and a wafer are relatively scanned and in which a circuit pattern formed on the reticle is projected and transferred onto plural shot regions on the wafer, wherein non-exposure light is projected to a particular location on the wafer and reflection light therefrom is received by a light receiving element, such that the surface position of the wafer is measured on the basis of a signal from the light receiving element, the focus measuring method being characterized in that: a wafer chuck on which the wafer is mounted is provided with a chuck mark; the position where the light is projected is determined by an optical system arranged to project non-exposure light; and the focus measuring method includes (i) a step of performing, at the light projected position, first focus measurement in regard to a particular location on the wafer, (ii) a step of detecting a relative position of the particular location on the wafer with respect to the chuck mark, (iii) a step of rotating the wafer chuck by 180 degrees, (iv) a step of aligning the particular location on the wafer with the light projected position, on the basis of the relative position with respect to the chuck mark, and performing second focus measurement, and (v) a step of detecting an offset of the particular location of the wafer, at the light projected position, on the basis of a first-focus-measurement measured value and a second-focus-measurement measured value.

[2] A focus measuring method applied to an exposure apparatus in which a reticle and a wafer are relatively scanned and in which a circuit pattern formed on the reticle is projected and transferred onto plural shot regions on the wafer, wherein non-exposure light is projected to a particular location on the wafer plural times and reflection light therefrom is received by a light receiving element, such that the surface position of the wafer is measured on the basis of a signal from the light receiving element, the focus measuring method being characterized in that: a wafer chuck on which the wafer is mounted is provided with a chuck mark; the positions where light is projected are determined by an optical system provided to project the non-exposure light; the light projected positions are disposed symmetrically with respect to a center position of all these light projected positions; and the focus measuring method includes (i) a step of performing, at the center position of all the light projected positions, first focus measurement in regard to the particular location on the wafer, (ii) a step of detecting a relative position of the particular location on the wafer, with respect to the chuck mark, (iii) a step of rotating the wafer chuck by 180 degrees, (iv) a step of aligning the particular location of the wafer with the center position of all the light projected positions, on the basis of the relative position with respect to the chuck mark, and performing second focus measurement, and (v) a step of detecting an offset of the particular location of the wafer, at each light projected position, wherein the offset is detected on the basis of a first-focus-measurement measured value at each light projected position and a second-focus-measurement measured value at a certain light projected position which is in a symmetrical positional relation with the center position of all the light projected positions.

[3] A focus measuring method according to Item [1] or [2], wherein the non-exposure light to be projected is light by which a mark is being projected.

[4] A focus measuring system applied to an exposure apparatus in which a reticle and a wafer are relatively scanned and in which a circuit pattern formed on the reticle is projected and transferred onto plural shot regions on the wafer, wherein non-exposure light is projected to a particular location on the wafer and reflection light therefrom is received by a light receiving element, such that the surface position of the wafer is measured on the basis of a signal from the light receiving element, the focus measuring system being characterized in that: a wafer chuck on which the wafer is mounted is provided with a chuck mark; the position where the light is projected is determined by an optical system arranged to project non-exposure light; and the focus measuring system includes (i) means for performing, at the light projected position, first focus measurement in regard to a particular location on the wafer, (ii) means for detecting a relative position of the particular location on the wafer with respect to the chuck mark, (iii) means for rotating the wafer chuck by 180 degrees, (iv) means for aligning the particular location on the wafer with the light projected position on the basis of the relative position with respect to the chuck mark, and performing second focus measurement, and (v) means for detecting an offset of the particular location of the wafer at the light projected position, on the basis of a first-focus-measurement measured value and a second-focus-measurement measured value.

[5] A focus measuring system applied to an exposure apparatus in which a reticle and a wafer are relatively scanned and in which a circuit pattern formed on the reticle is projected and transferred onto plural shot regions on the wafer, wherein non-exposure light is projected to a particular location on the wafer and reflection light therefrom is received by a light receiving element, such that the surface position of the wafer is measured on the basis of a signal from the light receiving element, the focus measuring system being characterized in that: a wafer chuck on which the wafer is mounted is provided with a chuck mark; the positions where light is projected are determined by an optical system provided to project the non-exposure light; the light projected positions are disposed symmetrically with respect to a center position of all these light projected positions; and the focus measuring system includes (i) means for performing, at the center position of all the light projected positions, first focus measurement in regard to the particular location on the wafer, (ii) means for detecting a relative position of the particular location on the wafer with respect to the chuck mark, (iii) means for rotating the wafer chuck by 180 degrees, (iv) means for aligning the particular location of the wafer with the center position of all the light projected positions, on the basis of the relative position with respect to the chuck mark, and performing second focus measurement, and (v) means for detecting an offset of the particular location of the wafer at each light projected position, wherein the offset is detected on the basis of a first-focus-measurement measured value at each light projected position and a second-focus-measurement measured value at a certain light projected position which is in a symmetrical positional relation with the center position of all the light projected positions.

[6] A focus measuring system according to Item [4] or [5], wherein the non-exposure light to be projected is light by which a mark is being projected.

[7] A focus measuring system according to Item [6], wherein a focus measuring mark is projected onto the wafer through a focus measuring projection optical system, and a projected image is re-imaged upon a light receiving element through a light receiving optical system, and wherein a surface on which the mark is formed and the surface of the wafer are placed in a Scheinmpflug's condition with respect to the projection optical system while the wafer surface and the surface of the light receiving element are placed in a Scheinmpflug's condition with respect to the light receiving optical system.

[8] A focus measuring method according to Item [1], [2] or [3], wherein the focus measurement for detecting the offset is carried out with regard to a first wafer in a single lot.

[9] A focus measuring method according to Item [1], [2] or [3], wherein the focus measurement for detecting the offset is carried out with regard to every single wafer process.

[10] A focus measuring method according to Item [1], [2] or [3], wherein the focus measurement for detecting the offset is carried out with regard to every single device pattern.

[11] An exposure method characterized by performing an exposure process by using an offset as recited in Item [1], [2] or [3].

[12] An exposure apparatus characterized by performing an exposure process by using an offset as recited in Item [4], [5] or [6].

[13] An exposure apparatus characterized by including offset detecting means as recited in Item [4], [5] or [6], wherein the offset detecting means is provided as an offset measuring apparatus separate from the exposure apparatus.

[14] An exposure apparatus according to Item [13] wherein the offset measuring apparatus can be controlled in relation to a single exposure apparatus or plural exposure apparatuses.

[15] A focus measuring method, a focus measuring system, an exposure method or an exposure apparatus as recited in any one of Items [1]-[14], wherein the exposure apparatus is a scanner or a stepper.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2005-210775 filed Jul. 21, 2005, for which is hereby incorporated by reference.

What is claimed is:

1. A surface position measuring method, applied to an exposure apparatus for exposing a surface of a substrate to light through a projection optical system, for measuring a position of the surface of the substrate, wherein measurement light is obliquely projected onto the substrate surface and the measurement light on that surface is detected and wherein, on the basis of a position of the detected measurement light and a predetected offset, the position of the substrate surface with respect to a direction of an optical axis of the projection optical system is measured, said method comprising steps of:

memorizing, as a first position, a position of a measurement point on the substrate while using, as a reference, a reference mark provided on a substrate stage which is configured to hold and move the substrate;

measuring, in accordance with information concerning the memorized first position and in relation to the measurement point, the position of the measurement light as a first measurement position;

rotating the substrate by 180 degrees in a plane perpendicular to the optical axis;

memorizing, as a second position, a position of the measurement point on the rotated substrate with reference to the reference mark;

measuring, in accordance with information concerning the memorized second position and in relation to the measurement point, the position of the measurement light as a second measurement position; and detecting the offset at the measurement point, on the basis of the first measurement position and the second measurement position.

2. An exposure apparatus including a projection optical system, for exposing a surface of a substrate to light through the projection optical system, said apparatus comprising:

a detecting system configured to obliquely project measurement light onto the substrate surface to detect the measurement light on that surface, and also to measure the position of the substrate surface with respect to a direction of an optical axis of the projection optical system on the basis of a position of the detected measurement light and a predetected offset;

a substrate stage configured to hold and move the substrate; and a controller which is configured (i) to memorize, as a first position, a position of a measurement point on the substrate while using, as a reference, a reference mark provided on said reference stage and to control operations of said detecting system and said substrate stage in accordance with information concerning the memorized first position, so as to measure, in relation to the measurement point, the position of the measurement light as a first measurement position, (ii) to control the operation of said substrate state so as to rotate the substrate by 180 degrees in a plane perpendicular to the optical axis, (iii) to memorize, as a second position, a position of the measurement point on the rotated substrate with reference to the reference mark and to control the operations of said detecting system and said substrate stage in accordance with information related to the memorized second position, so as to measure, in relation to the measurement point, the position of the measurement light as a second measurement position, and (iv) to detect the offset at the measurement point, on the basis of the first measurement position and the second measurement position.

3. A method of manufacturing a device, said method comprising steps of:

exposing a substrate to light using an exposure apparatus as defined in claim 2;

developing the exposed substrate; and processing the developed substrate to manufacture the device.

* * * * *

UNITED STATES PATENT AND TRADEMARK OFFICE
CERTIFICATE OF CORRECTION

PATENT NO. : 7,313,873 B2 Page 1 of 1
APPLICATION NO. : 11/489896
DATED : January 1, 2008
INVENTOR(S) : Satoru Oishi It is certified that error appears in the above-identified patent and that said Letters Patent is hereby corrected as shown below:

Column 12, line 50, delete "This method-is" and insert -- This method is --

Signed and Sealed this

Seventh Day of October, 2008

JON W. DUDAS
*Director of the United States Patent and Trademark Office*